US006979393B2

(12) United States Patent
Rodbell et al.

(10) Patent No.: US 6,979,393 B2
(45) Date of Patent: Dec. 27, 2005

(54) METHOD FOR PLATING COPPER CONDUCTORS AND DEVICES FORMED

(75) Inventors: Kenneth P. Rodbell, Sandy Hook, CT (US); Panayotis C. Andricacos, Croton-on-Hudson, NY (US); Cyril Cabral, Jr., Ossining, NY (US); Lynne M. Gignac, Beacon, NY (US); Cyprian E. Uzoh, Milpitas, CA (US); Peter S. Locke, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 332 days.

(21) Appl. No.: 10/055,134

(22) Filed: Jan. 22, 2002

(65) Prior Publication Data

US 2002/0066673 A1   Jun. 6, 2002

Related U.S. Application Data

(63) Continuation of application No. 09/418,197, filed on Oct. 13, 1999, now Pat. No. 6,344,129.

(51) Int. Cl.$^7$ ............................................... C25D 5/02

(52) U.S. Cl. ..................... 205/291; 438/128; 438/618; 257/629; 257/762; 257/773

(58) Field of Search ............................... 438/128, 618; 257/629, 762, 773; 205/291

(56) References Cited

U.S. PATENT DOCUMENTS

| 2,700,019 | A | | 1/1955 | Jernstedt et al. |
| 3,562,117 | A | | 2/1971 | Vander Mey |
| 6,077,412 | A | | 6/2000 | Ting et al. |
| 6,103,086 | A | * | 8/2000 | Woo et al. .................. 205/164 |
| 6,136,707 | A | * | 10/2000 | Cohen ........................ 438/687 |
| 6,251,806 | B1 | * | 6/2001 | Chang et al. ............... 438/782 |
| 6,417,572 | B1 | * | 7/2002 | Chidambarrao et al. .... 257/773 |
| 6,465,376 | B2 | * | 10/2002 | Uzoh et al. ................. 438/627 |

* cited by examiner

*Primary Examiner*—Arun S. Phasge
(74) *Attorney, Agent, or Firm*—Randy W. Tung; Robert Trepp

(57) ABSTRACT

A method for plating copper conductors on an electronic substrate and devices formed are disclosed. In the method, an electroplating copper bath that is filled with an electroplating solution kept at a temperature between about 0° C. and about 18° C. is first provided. A copper layer on the electronic substrate immersed in the electroplating solution is then plated either in a single step or in a dual-step deposition process. The dual-step deposition process is more suitable for depositing copper conductors in features that have large aspect ratios, such as a via hole in a dual damascene structure having an aspect ratio of diameter/depth of more than ⅓ or as high as 1/10. Various electroplating parameters are utilized to provide a short resistance transient in either the single step deposition or the dual-step deposition process. These parameters include the bath temperature, the bath agitation, the additive concentration in the plating bath, the plating current density utilized, the deposition rate of the copper film and the total thickness of the copper film deposited.

3 Claims, 4 Drawing Sheets

METHOD FOR PLATING COPPER CONDUCTORS AND DEVICES FORMED

This application is a division of application Ser. No. 09/418,197, filed Oct. 13, 1999, now U.S. Pat. No. 6,344,129.

FIELD OF THE INVENTION

The present invention generally relates to a method for plating copper conductors on an electronic substrate and devices formed by the method and more particularly, relates to a method for plating copper conductors on an electronic substrate in a plating bath kept at a temperature below 18° C. with a low dopant concentration resulting in improved resistance transient in plated copper films and devices made by such method.

BACKGROUND OF THE INVENTION

In the recent development of semiconductor fabrication technologies, the replacement of aluminum-copper alloy by pure copper as a chip interconnection material results in numerous advantages in the chip performance. Conventionally, aluminum-copper and its related alloys have been used as a preferred metal conductor material for forming interconnections on electronic devices such as IC chips. The copper content in an aluminum-copper alloy is limited typically to a range between about 0.3 and about 4%.

The chip performance made possible by pure copper or copper alloys includes a lower electrical resistivity since the resistivity of copper and certain copper alloys is less than the resistivity of aluminum-copper. Based on the low resistivity of copper, narrower lines can be used and higher wiring densities can also be realized.

While the advantages of copper metalization have been recognized by many in the semiconductor industry, copper metalization has been the subject of extensive research effort in recent years. Semiconductor processes such as chemical vapor deposition (CVD) and electroless plating are popularly used for depositing copper. Both of these methods of deposition produce at best conformal deposits and sometimes lead to defects such as voids in a wiring structure, especially when trenches are deposited which have a cross-section narrower at the top than at the bottom as a result of an imperfect reactive ion etching process. Similarly, while the electroless plating technique offers the advantage of low cost, the evolution of hydrogen gas during deposition leads to blistering and other void defects which are detrimental to the quality and reliability of IC devices built.

One such electroplating processes for depositing copper, silver or gold onto a semiconductor wafer is described in U.S. Pat. No. 5,256,274 issued in 1993. In this patent, a copper conductor which is obtained with a seam at is center is judged as a good deposition while a copper conductor with a void at its center is judged as bad deposition. The plating bath utilized in the patent contains 12 ounces/gallon of water of $CuSO_4 \cdot 5H_2O$, 10% by volume of concentrated sulfuric acid, 50 ppm of chloride ion from hydrochloric acid, and TECHNI-COPPER® W additive at 0.4% by volume provided by Technic, Inc. of Providence, R.I. The plating glasses were selectively deposited through an inert mask.

The electroplated copper that is presently being used as line and via level interconnections in semiconductor devices suffers from an initially high resistance which requires either a long time, i.e., three days, room temperature anneal or some shorter time elevated temperature anneal to reduce the films to acceptable resistance levels. Typically, electroplated copper films are deposited in a fine grained condition from baths that contain additives or dopants. With time, these initially small copper grains, i.e., in the range of approximately 20 nm, grow to a final large grain, i.e., in the range of 1,000 nm low stress microstructure during which time a resistance drop of approximately 20~30% occurs. The large grained, low resistance, plated copper is preferred since it has both better electromigration stress voiding behavior than fine grained copper films and the desired high electrical conductivity.

The plated copper films that are presently used in semiconductor devices as line and via level interconnections suffer from an initially high resistance which requires either a long time period, i.e., three days room temperature anneal or shorter time at elevated temperatures, to reduce the high resistance to acceptable resistance levels. The long anneal times required therefore places unacceptable limits on the fabrication process which results in a more expensive copper process. In order to speed up the fabrication processes, it is important that this grain growth and associated resistance drop, i.e., the resistance transient, occur in as short a time as possible.

It is therefore an object of the present invention to provide a method for plating copper conductors on an electronic substrate that does not have the drawbacks or shortcomings of the conventional methods.

It is another object of the present invention to provide a method for plating copper conductors on an electronic substrate which produces copper films with short resistance transient.

It is a further object of the present invention to provide a method for plating copper conductors on an electronic substrate by carrying out the electroplating process in a plating bath maintained at a temperature below 18° C.

It is another further object of the present invention to provide a method for plating copper conductors on an electronic substrate wherein copper films of large grain size and low electrical resistance are plated.

It is still another object of the present invention to provide a method for plating copper conductors on an electronic substrate wherein copper films of low resistance transient are plated in a bath maintained at a low temperature and a low additive concentration of not more than 5 mL/L.

It is yet another object of the present invention to provide a method for plating copper conductors on an electronic substrate for producing copper films of short resistance transient wherein a low electrical resistance plated film can be obtained in less than 10 hours of room temperature annealing.

It is still another further object of the present invention to provide a method for plating copper conductors in a structure of high aspect ratio by a two-step plating process wherein two copper layers are separately plated.

It is yet another further object of the present invention to provide a method for plating copper conductors in a high aspect ratio via opening by plating a first layer of copper in a plating bath containing high additive concentration and then plating a second layer of copper in a plating bath containing low additive concentration such that a copper film of short resistance transient is obtained.

SUMMARY OF THE INVENTION

In accordance with the present invention, a method for plating copper conductors on an electronic substrate and devices formed are provided.

In a preferred embodiment, a method for plating copper conductors on an electronic substrate can be carried out by the operating steps of first providing an electroplating copper bath filled with an electroplating solution, maintaining the electroplating solution at a temperature between about 0° C. and about 18° C., and then electroplating a copper layer on the electronic substrate immersed in the electroplating solution.

In the method for plating copper conductors on an electronic substrate, the method may further include the step of maintaining the electroplating solution at a temperature preferably between about 5° C. and about 15° C., and more preferably between about 8° C. and about 12° C.

In an alternate embodiment, a method for plating copper conductors on an electronic substrate may be carried out by the operating steps of providing a copper electroplating solution in a plating bath, adding an additive to the copper electroplating solution to a concentration of not more than 5 mL/L, maintaining the copper electroplating solution at a temperature not higher than 18° C. and electroplating a copper layer on the electronic substrate immersed in the copper electroplating solution.

In the method for plating copper conductors on an electronic substrate, the additive is added to the electroplating solution to a concentration of not more than 3 mL/L MLo, or to a concentration of not more than 15 mL/L MD. The method may further include the step of maintaining a wafer rotational speed at less than 100 RPM. The method may further include the step of maintaining a plating current density at least 15 mA/cm$^2$. The method may further include the step of maintaining a deposition rate of at least 5 nm/sec. The method may further include the step of electroplating a copper layer to a thickness of at least 0.5 $\mu$m.

The method for plating copper conductors on an electronic substrate may further include the steps of maintaining a additive concentration in the electroplating solution at not more than 5 mL/L, maintaining a wafer rotational speed at less than 100 RPM, maintaining a plating current density of at least 15 mA/cm$^2$, and maintaining a deposition rate of at least 5 nm/sec.

In still another alternate embodiment, a method for plating copper conductors on an electronic substrate may be carried out by the operating steps of first depositing a first layer of copper on the electronic substrate in a first electroplating solution containing a additive concentration of more than 5 mL/L, and then depositing a second layer of copper on top of the first layer of copper in a second electroplating solution containing a additive concentration of less than 5 mL/L. The method may further include the step of plating a dual damascene structure of trench/via. The method may further include the step of depositing the first layer of copper in a via hole which has an aspect ratio of diameter/depth of at least ⅓.

The method for plating copper conductors in an electronic substrate by a dual-step plating method may further include the step of depositing the second layer of copper in a second electroplating solution maintained at a temperature not higher than 18° C., the step of depositing the second layer of copper in a second electroplating solution with the substrate rotating at a rotational speed of less than 100 RPM, or the step of depositing the second layer of copper in a second electroplating solution that is maintained at a plating current density of at least 15 mA/cm$^2$.

The method of plating copper conductors on an electronic substrate by a dual-step electroplating process may further include the step of depositing the second layer of copper in a second electroplating solution at a deposition rate of at least 5 nm/sec, or the step of depositing the second layer of copper in a second electroplating solution to a thickness of at least 0.5 $\mu$m.

The method for plating copper conductors on an electronic substrate by a dual-step plating process may further include the steps of maintaining the second electroplating solution at a temperature of not higher than 18° C., rotating the substrate at a speed of less than 100 RPM, conducting the plating at a current density of at least 15 mA/cm$^2$, and depositing the copper layer at a deposition rate of at least 5 nm/sec.

The present invention is further directed to a semiconductor structure of a damascene or dual-damascene interconnect formed by a trench-filling process of electroplated Cu having an as deposited grain size of not less than 0.05 $\mu$m and a decrease in electrical resistance of at least 15% after a time period of not more than 30 hours at about 21° C.

In the semiconductor structure of a damascene or dual-damascene interconnect, the as-deposited grain size of the electroplated Cu is between about 0.05 $\mu$m and about 0.15 $\mu$m, The grain size of the electroplated Cu after the time period of not more than 30 hours at about 21° C. is between about 1.5 $\mu$m and about 2 $\mu$m.

BRIEF DESCRIPTION OF THE DRAWINGS

These and other objects, features and advantages of the present invention will become apparent from the following detailed description and the appended drawings in which.

DETAILED DESCRIPTION OF THE PREFERRED AND ALTERNATE EMBODIMENTS

Figure 1:
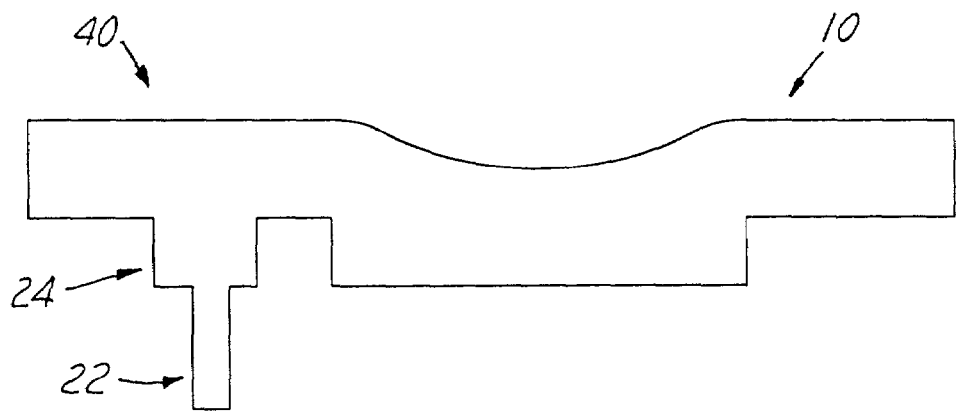
FIG. 1 is an enlarged, cross-sectional view of a dual damascene structure in an electronic substrate that is deposited with copper by the present invention method in a single layer.

The present invention discloses a method for plating copper conductors on an electronic substrate by first providing an electroplating copper bath filled with an electroplating solution, maintaining the electroplating solution at a temperature between about 0° C. and about 18° C., and electroplating a copper layer on the electronic substrate immersed in the electroplating solution. A preferred temperature of the electroplating solution may be between about 5° C. and about 15° C., and a more preferred temperature for the electroplating solution may be between about 8° C. and about 12° C. The electroplating solution should have a low additive concentration such as one that is below 5 mL/L. Other desirable processing conditions that further contribute to a fast resistivity transient are maintaining a wafer rotational speed at less than 100 RPM, maintaining a plating current density at least 15 mA/cm$^2$, maintaining a deposition rate of at least 5 nm/sec, and electroplating a copper layer to a thickness of at least 0.5 $\mu$m.

In an alternate embodiment, the present invention method for plating copper conductors on an electronic substrate can be carried out in a dual-step electroplating process in which a first layer of copper is deposited on an electronic substrate in a first electroplating solution that contains an additive concentration of more than 5 mL/L, and then depositing a second layer of copper on top of the first layer of copper in a second electroplating solution which contains an additive concentration of less than 5 mL/L. The dual-step electroplating process is especially advantageous in producing a copper conductor that has a short resistivity transient in a via plug that has a high aspect ratio, i.e., a via plug which has an aspect ratio of diameter/depth of at least ⅓. In the dual-step deposition process, the first electroplating process is conducted with a high additive concentration in the electroplating solution such that the hole fill capability of the plating process is greatly improved. The second electroplating process is conducted in an electroplating solution that has a very low concentration of additive such that a copper film of low resistivity transient is obtained in the second electrodeposition process.

In order to speed up the IC fabrication process, it is important that the grain growth and associated resistance decrease, i.e., the resistance transient, occur in as short a time as possible. It is, therefore, one aim of the invention to describe methods to accelerate the resistance transient. The present invention method can be further accelerated with elevated temperature anneals, however, it is a secondary purpose of this invention to provide means for the resistance transient to occur at low temperatures since it has been shown that low temperature anneals are preferable. It is another purpose of the present invention to provide structures which can easily incorporate the techniques outlined below to achieve both good hole filling of high aspect ratio features, and to transform quickly to the desired large grain, low resistance microstructure.

The present invention teaches techniques which lower the dopant levels in plated copper to levels which allow both adequate fill and fully transformed films to be simultaneously achieved. In the limit of baths as containing no additives, or no dopants, one obtains low resistance films with no resistance transient, however, these baths are unable to adequately fill high aspect ratio features such as via holes. The parameters illustrated below all lead to a lowering of the dopant levels in plated copper films and promote the formation of large grain, low stress, low resistant films. The parameters can be applied to commonly used copper plating baths such as ETHONE-OMI® and LeaRonal® and will work in commonly used plating tools such as one of cup and paddle cell geometry. The present invention shows that low dopant incorporation in plated copper films accelerates the resistance transient. The parameters specified for achieving low dopant incorporation include control of bath temperature, bath agitation and wafer rotational speed, bath additive concentration, plating current density and control of the overburden thickness. The term overburden as used in this application is defined as some multiple of the trench depth filled, and is the amount of material above the wafer plane which is subsequentially removed by a subtractive technique. It is important that the microstructural/resistance transformation takes place in as short time as possible. Annealing accelerates the transformation, but may not always lead to the desired final state.

The present invention discloses a technique to lower the dopant levels in the plated copper film which allow for both adequate fill and low resistance films to be simultaneously achieved. The parameters included in the technique which may be used to achieve these purposes lead to a lowering of the dopant levels in the plated copper film and promote a large grained, low stress, low resistance film and furthermore, can be applied to commonly used copper plating baths.

Copper plating from solutions incorporating additives conventionally used to produce level deposits on a rough surface can be used to accomplish superfilling required to fill submicron cavities. One suitable system of additives is marketed by Enthone-OMI, Inc., of New Haven, Conn. known as the SelRex Cubath M system. The above additives are referred to by the manufacturer as mLo+MD. Another suitable system of additives is the one marketed by Lea Ronal, Inc., of Freeport, N.Y., known as the Copper Gleam 2001 system. The additives are referred to by the manufacturer as Copper Gleam 2001 Carrier, Copper Gleam 2001-HTL, and Copper Gleam 2001 Leveller. And another suitable system of additives is the one marked by Atotech USA, Inc., of State Park, Pa., and is known as the Cupracid HS system. The additives in this system are referred to by the manufacturer as Cupracid Brightener and Cupracid HS Basic Leveller.

Additives may be added to the bath for accomplishing various objectives. The bath may include a copper salt and a mineral acid. Additives may be included for inducing in the conductor specific film microstructures including large grain size relative to film thickness or randomly oriented grains. Also, additives may be added to the bath for incorporating in the conductor material molecular fragments containing atoms selected from the group consisting of C, O, N, S and Cl whereby the electromigration resistance is enhanced over pure Cu. Furthermore, additives may be added to the bath for inducing in the conductor specific film microstructures including large grain size relative to film thickness or randomly oriented grains, whereby the electromigration behavior is enhanced over non-electroplated Cu.

Examples of specific additives which may be added to a bath in the instant invention are described in several patents. U.S. Pat. No. 4,110,176, which issued on Aug. 29, 1978 to H-G Creutz et al., entitled "Electrodeposition of Copper" describes the use of additives in a plating bath such as poly alkanol quaternary-ammonium salt which formed as a reaction product to give bright, highly ductile, low stress and good leveling copper deposits from an aqueous acidic copper plating bath which patent is incorporated herein by reference.

U.S. Pat. No. 4,376,685, which issued on Mar. 15, 1983, to A. Watson entitled "Acid Copper Electroplating Baths Containing Brightening and Leveling Additives" described additives to a plating bath such as alkylated polyalkylene-imine which form as a reaction product to provide bright and leveled copper electrodeposits from an aqueous acidic bath which patent is incorporated herein by reference.

U.S. Pat. No. 4,975,159 which issued on Dec. 4, 1990 to W. Dahrns, entitled "Aqueous Acidic Bath for Electrochemical Deposition of a Shiny and Tear-Free Copper Coating and Method of Using Same" described adding to an aqueous acidic bath combinations of organic additives including at least one substituted alkoxylated lactam as an amide-group-containing compound in an amount to optimize the brightness and ductility of the deposited copper, which patent is incorporated herein by reference. In U.S. Pat. No. 4,975,159, Table I lists a number of alkoxylated lactams which may be added to a bath in the instant invention. Table II lists a number of sulfur-containing compounds with water-solubilizing groups such as 3-mercaptopropane-1-sulfonic acid which may be added to a bath in the instant invention. Table III lists organic compounds such as polyethylene glycol which may be added to a bath as surfactant in the instant invention.

U.S. Pat. No. 3,770,598 which issued on Nov. 6, 1973 to H-G Creutz entitled "Electrodeposition of Copper from Acid Baths" describes baths for obtaining ductile, lustrous copper containing therein dissolved a brightening amount of the reaction product of polyethylene imine and an alkylating agent to produce a quaternary nitrogen, organic sulfides carrying at least one sulfonic group, and a polyether compound such as polypropylene glycol, which patent is incorporated herein by reference.

U.S. Pat. No. 3,328,273 which issued on Jun. 27, 1967 to H-G Creutz et al entitled "Electrodeposition of Copper from Acidic Baths" describes copper sulfate and fluoborate baths for obtaining bright, low-stress deposits with good leveling properties that contain organic sulfide compounds of the formula $XR_1—(S_n)—R_2—SO_3H$, where $R_1$ and $R_2$ are the same or different and are polymethylene groups or alkyne groups containing 1–6 carbon atoms, X is hydrogen or a sulfonic group, and n is an integer of 2–5 inclusive, which patent is incorporated herein by reference. Additionally these baths may contain polyether compounds, organic sulfides with vicinal sulphur atoms, and phenazine dyes. In U.S. Pat. No. 3,328,273, Table I lists a number of polysulfide compounds which may be added to a bath in the instant invention. Table II lists a number of polyethers which may be added to a bath in the instant invention.

It is a main object of the present invention to provide a method for fabricating interconnections, or metal conductors, on semiconductor devices and in packaging applications using electroplated copper with additives where plating occurs under conditions such that the bath temperature is controlled between about 0° C. and about 18° C., preferably between about 5° C. and about 15° C., and most preferably between about 8° C. and about 12° C.

The present invention may further provide a method for fabricating interconnections on semiconductor devices and in packaging applications using electroplated copper with dopants where the plated copper film is deposited on a copper seed layer which has poor (111) texture, or (111) crystallographic plane orientation. The texture in these copper seed layers is modulated by controlling the texture in the underlying barrier layers. In general, any barrier layer such as W, TiN, Cr, etc., as long as it imparts a poor texture to the copper seed layer deposited on top.

The present invention further provides a method for fabricating interconnections on semiconductor device and in packaging applications using electroplated copper with dopants where the plating occurs in baths that have well controlled additive levels. In general, the lesser additives the faster the resistance transient. It has been found that the additive, that is added to the electroplating solution should have a concentration of not more than 3 mL/L MLo, or a concentration of not more than 15 ml/L MD.

The present invention further provides a method for fabricating interconnections on semiconductor devices and in packaging applications using electroplated copper with additives where the plating occurs under controlled agitation. The bath agitation includes both electrolyte flow and wafer rotation speed. For instance, plating at low rotational speeds, i.e., 60 RPM in a Semitool machine or 100~120 RPM in a Novellus machine, produces plated copper films that have low dopant concentrations and faster resistance transient. In cup platers, one can control the agitation by varying both the wafer rotational speed and the electrolyte flow rate. In paddle cells, one can vary the paddle frequency and the electrolyte recirculation rate.

The method for fabricating interconnections on semiconductor devices and in packaging applications using electroplated copper with dopants where plating occurs in specified ranges of current density, i.e., between about 20 and about 70 mA/cm$^2$, high current densities have been shown to result in less dopant incorporation and, therefore faster resistance transient.

Figure 9:
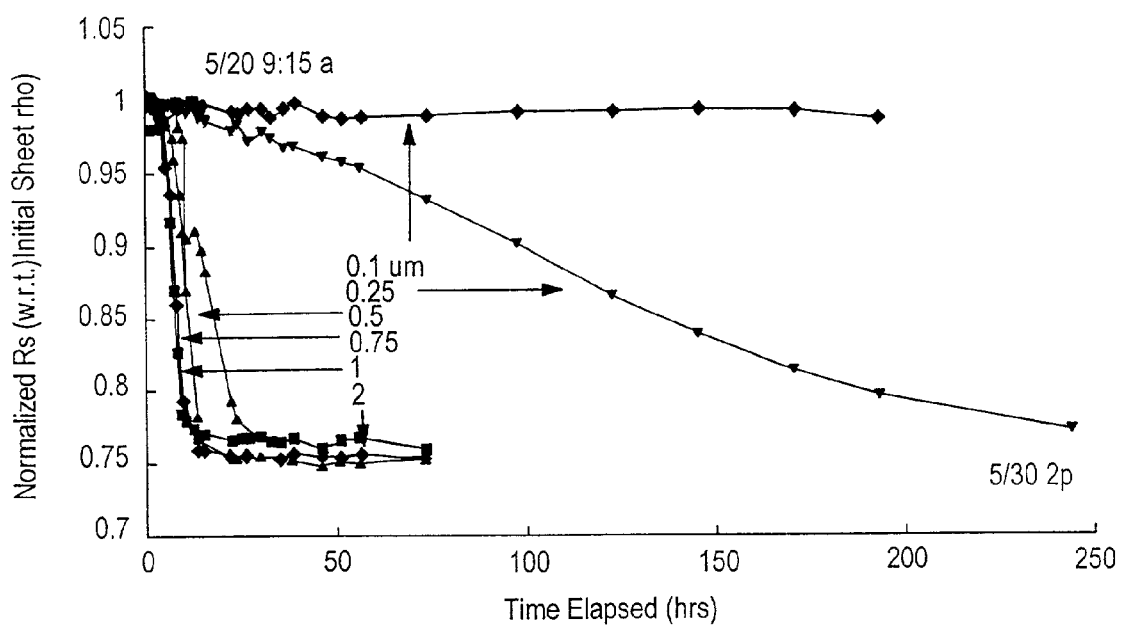
FIG. 9 is a graph illustrating the resistivity transient at room temperature as a function of the copper film thicknesses.

The method for fabricating interconnections on semiconductor devices and in packaging applications utilizing electroplated copper with dopants where plating continues until a substantial overburden is formed such that the resistant transient occurs rapidly. The definition of overburden is crucial since scaling to smaller dimensions decreases the specific critical thickness required for this effect to be important, e.g., for 400 nm deep trenches a 1,000 nm overburden is sufficient but for 20 nm deep trenches, significantly less overburden would be required. The film thickness data made by the present invention method is shown in FIG. 9.

The various parameters discussed above can be specified alone or can be used in combination with the low temperature bath, where the bath temperature is controlled between about 0° and about 18° C.

Figure 2:
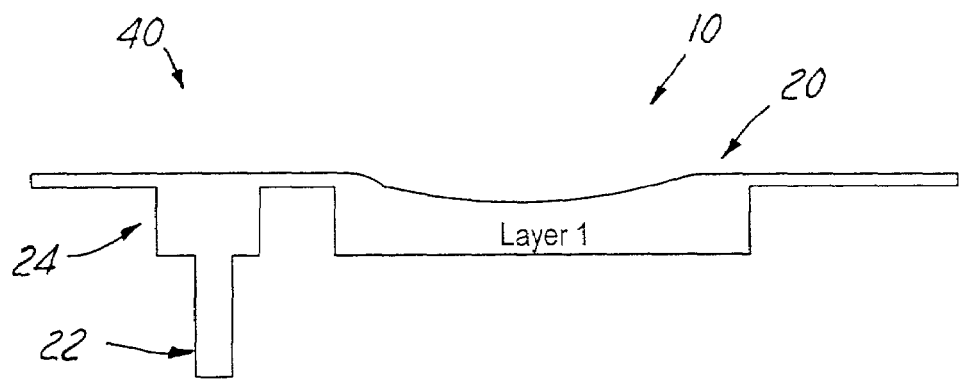
FIG. 2 is an enlarged, cross-sectional view of a dual damascene structure with a first layer deposited by the present invention method.
Figure 3:
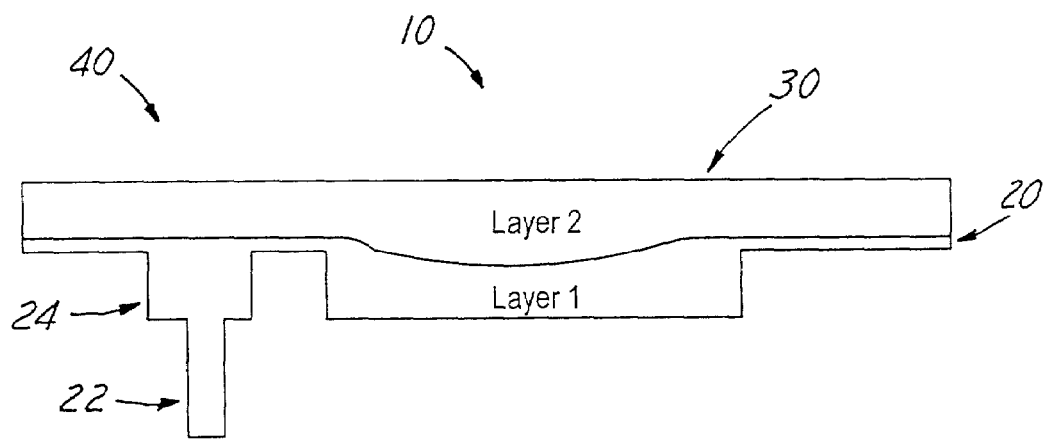
FIG. 3 is an enlarged, cross-sectional view of the dual damascene structure with a second layer deposited on top of the first layer by the present invention dual-layer deposition technique.
Figure 4:
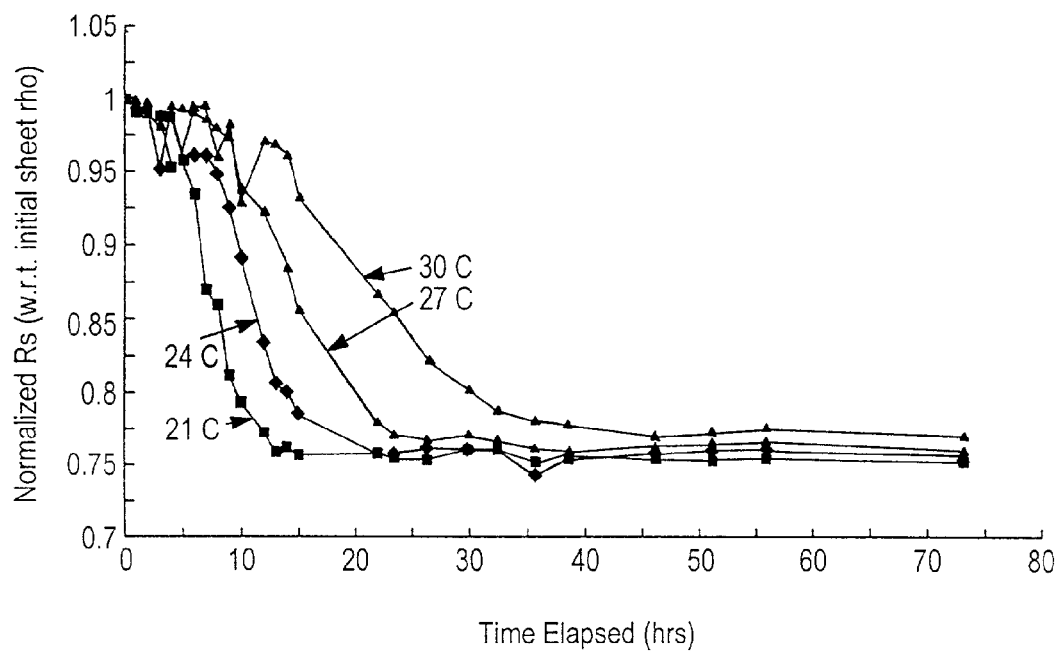
FIG. 4 is a graph illustrating the resistivity transient at room temperate as a function of plating bath temperatures.
Figure 5:
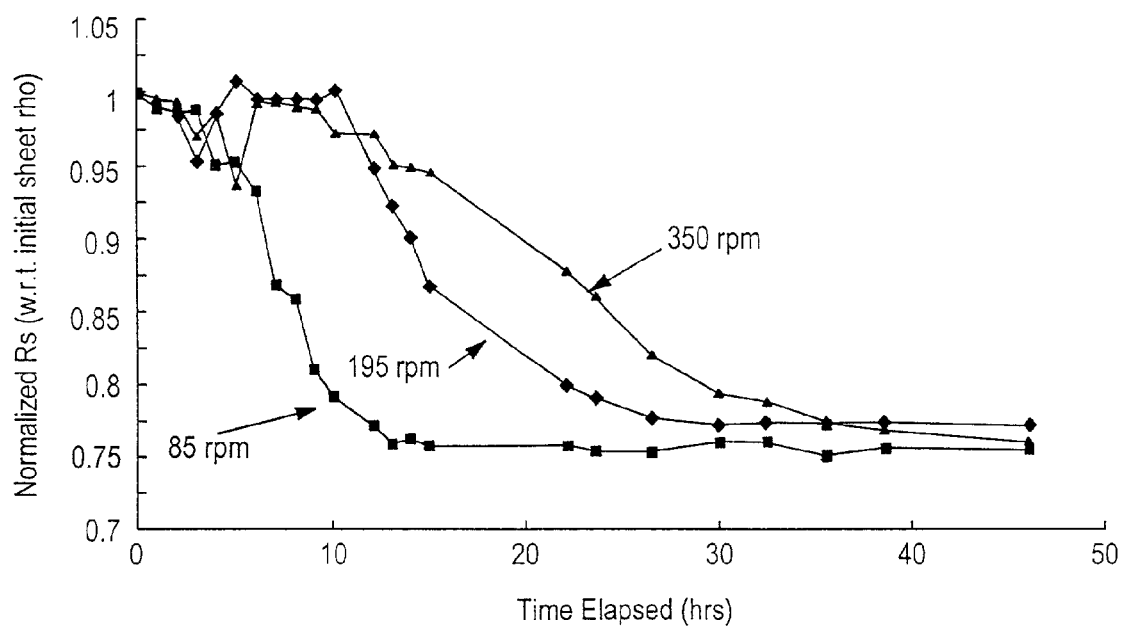
FIG. 5 is a graph illustrating the resistivity transient at room temperature as a function of wafer rotational speed in an electroplating bath solution.
Figure 6:
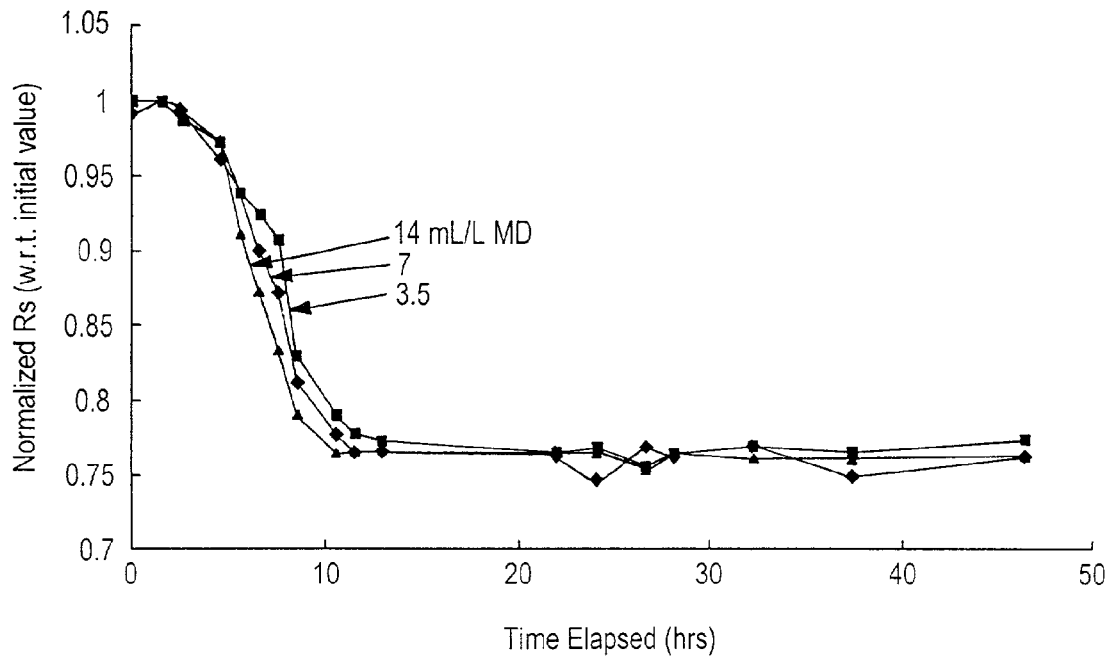
FIG. 6 is a graph illustrating the resistivity transient at room temperature as a function of dopant MD concentration.
Figure 7:
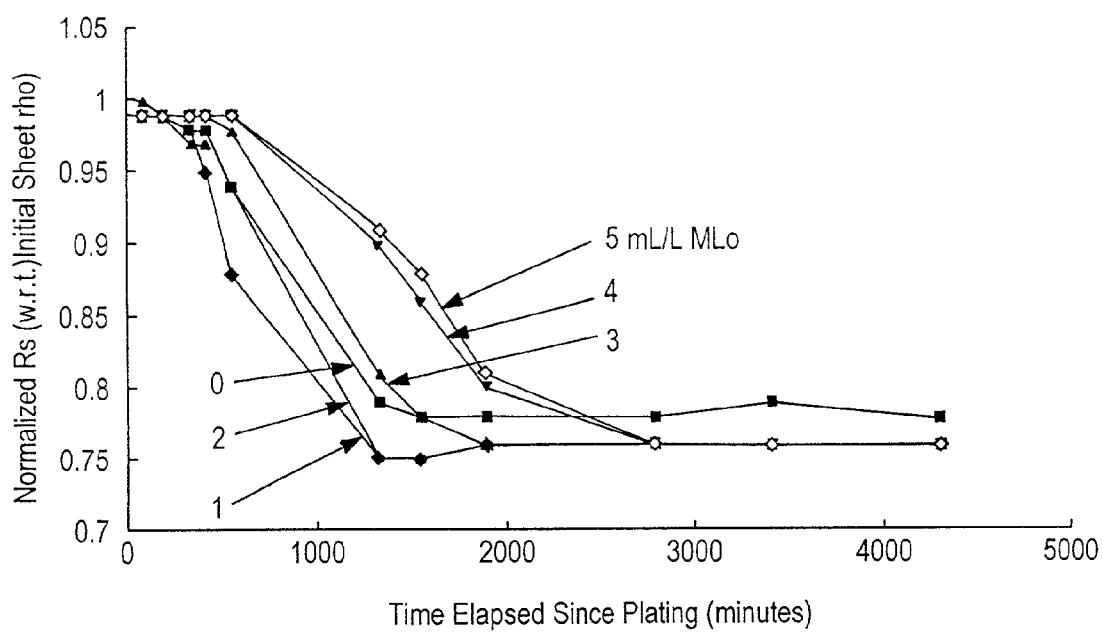
FIG. 7 is a graph illustrating the resistivity transient at room temperature as a function of dopant MLo concentration.
Figure 8:
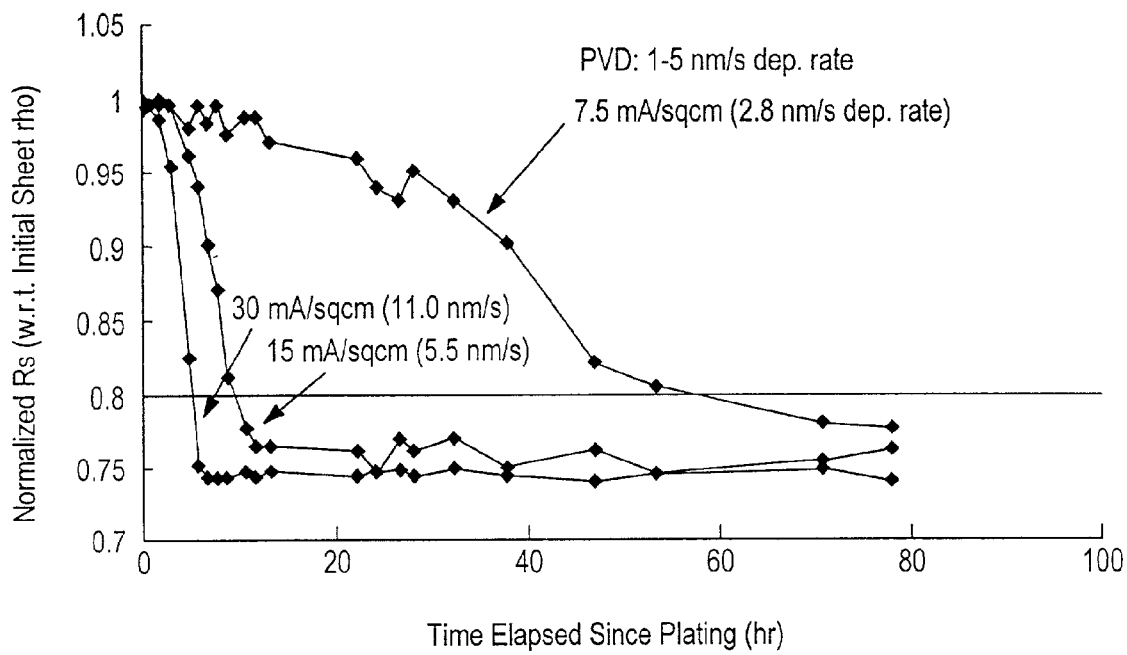
FIG. 8 is a graph illustrating the resistivity transient at room temperature as a function of plating current densities.

At high aspect ratios, as shown in samples in FIGS. 2 and 3, it may be impossible to incorporate a low level of dopants in the features. Since a higher concentration of dopants is required to achieve adequate fill of the high aspect ratio via holes. It is proposed that an alternate method be used to achieve both good fill and a fast resistance transient. A bi-layer construction is therefore proposed in which a first layer 20 which is typically a slow transforming, high dopant containing film that achieves good fill is deposited first, followed by a second plated film 30 in which the dopant level is minimized using any or all of the parameter controls discussed previously. By combining these two layers 20, 30, one can easily obtain both good fill and large grained, low resistance films. It is also apparent that incorporating more than 2 layers would also achieve the same desirable result.

As shown in FIG. 2, for trench and via holes that have a large aspect ratio, i.e., generally larger than diameter or width/depth of ⅓, or as high as ⅒, it is proposed that the copper film to be plated as a bi-layer. The bottom layer 20 fills the features of a damascene structure of the via 22 and trench 24. The top layer, or the overburden layer 30 is plated under conditions that favor fast transformation of the total copper film. The dual damascene structure 40 shown in FIGS. 1~3 consists of a trench 24 on top of a via 22 and a single damascene structure 10 of much larger width and therefore a lower aspect ratio. In the process, copper metal is electroplated to such a thickness that both the dual damascene structure 40 and the single damascene structure 10 are filed. The thickness required to fill the dual damascene structure is much less than the thickness required to fill the large feature. An excess amount of metal, i.e., the overburden layer 30 is thus deposited on top of the dual damascene feature 40 which is subsequently removed by a planarization step. Some overburden layer also exists on top of the large feature since depositing the exact thickness of metal required to fill it may create defects arising from small non-uniformities and other factors.

Although the deposition of large amounts of overburden in itself accelerates the microstructure-resistance transformation (transient) of the metal from a fine grained/high resistance state to a large grain/low resistance state, the deposition of excess overburden need not take place under the same conditions as the rest of the useful metal. It is therefore an object of the present invention to utilize useful metal for depositing and filling the dual damascene structure 40 as shown in FIG. 3.

In FIG. 3, after the deposition of the first layer 20, the excess overburden layer 30 is then deposited under conditions that favor fast transformation of the entire bi-layer, i.e., layers 20 and 30. A variation of the process is to fill both small and large features with useful metal and subsequentially depositing the fast-transforming excess overburden.

In the bi-layer deposition, or the dual-step deposition process, the second layer is plated at a temperature lower than the temperature used to plate the first layer. For instance, the plating temperature should be no higher than 18° C. while above the freezing temperature of the bath. A preferred temperature range is between about 5° C. and about 15° C., and a more preferred temperature range is between about 8° C. and about 12° C. The second layer should be plated at a level of bath agitation below the level used to plate the first layer. For instance, the wafer rotational speed should be maintained at less than 100 RPM. The second layer should be plated at a current density above the current density used to plate the first layer, i.e., the current density used to plate the second layer should be at least 15 mA/cm$^2$. The second layer should be plated in a bath in which the concentration additives is less than the concentration of the same additives used in plating the first layer. For instance, the dopant concentration in the electroplating solution should be less than 5 mL/L. More specifically, the dopant concentration in the electroplating solution should be less than 3 mL/L M Lo, or less than 15 mL/L MD. The combination of the desirable plating parameters disclosed above such as low temperature, low agitation level, relatively high current density and relatively low additive concentrations produce a second copper layer that has a fast resistance transient.

The present invention can be further implemented by utilizing plating tools that are currently used to deposit copper with modifications to include the option of plating the two layers under different conditions. For instance, if only current density and bath agitation are chosen as the parameters to vary, no tool modification is necessary. In practice, it may be desirable to vary other parameters, such as plating temperature as a very effective variable in accelerating the transformation. The plating chamber can be connected to two separate bath reservoirs each operating under conditions for plating the first or the second layer and admitted to the chamber sequentially. Alternatively, the wafer can go from chamber 1 connected to bath 1 for plating the first layer, and then to chamber 2 connected to bath 2 for plating the second layer. It is also possible that only one chamber and bath are employed with the bath temperature being lowered between the two plating runs.

It should be noted that while the present invention novel method has been presented in terms of an electroplating technique as the preferred method of copper deposition, the present invention method for depositing a copper conductor in two separate steps may further be applied to any other deposition processes such as PVD, CVD, etc. Furthermore, the present invention novel method is not limited to copper deposition since other metals such as aluminum, gold, silver have been shown to exhibit microstructural transformation from the as-deposited state to a different state. Moreover, annealing normally accelerates the transformation but may not lead to the desired state. Annealing the bi-layer is also possible for further improving the properties of the copper conductor.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

What is claimed is:

1. A semiconductor structure of a damascene or dual damascene interconnect formed by a trench-filling process of electroplated Cu having an as-deposited grain size of not less than 0.5 $\mu$m and a decrease in electrical resistance of at least 15% after a time period of not more than 30 hours at about 21° C.

2. A semiconductor structure of a damascene or dual damascene interconnect according to claim 1, wherein said as-deposited grain size of electroplated Cu is between about 0.5 $\mu$m and about 1.15 $\mu$m.

3. A semiconductor structure of a damascene or dual damascene interconnect according to claim 1, wherein said grain size of said electroplated Cu after said time period of not more than 30 hours at about 21° C. is between about 1.5 $\mu$m and about 2 $\mu$m.

* * * * *